United States Patent
Redaelli et al.

(10) Patent No.: US 9,570,677 B2
(45) Date of Patent: *Feb. 14, 2017

(54) MEMORY CELLS, INTEGRATED DEVICES, AND METHODS OF FORMING MEMORY CELLS

(71) Applicant: Micron Technology, Inc., Boise, ID (US)

(72) Inventors: Andrea Redaelli, Casatenovo (IT); Ugo Russo, Boise, ID (US); Agostino Pirovano, Milan (IT); Simone Lavizzari, Nova Milanese (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/049,100

(22) Filed: Feb. 21, 2016

(65) Prior Publication Data

US 2016/0172587 A1 Jun. 16, 2016

Related U.S. Application Data

(60) Continuation of application No. 14/225,111, filed on Mar. 25, 2014, now Pat. No. 9,299,930, which is a
(Continued)

(51) Int. Cl.
*H01L 45/00* (2006.01)
*G11C 13/00* (2006.01)

(52) U.S. Cl.
CPC ........... *H01L 45/06* (2013.01); *G11C 13/0004* (2013.01); *H01L 45/126* (2013.01); *H01L 45/128* (2013.01);
(Continued)

(58) Field of Classification Search
CPC .... G11C 13/0004; H01L 45/16; H01L 45/126; H01L 45/128
See application file for complete search history.

(56) References Cited

U.S. PATENT DOCUMENTS 4,080,719 A 3/1978 Wilting
4,499,557 A 2/1985 Holmberg
(Continued)

FOREIGN PATENT DOCUMENTS

EP 128506979 6/2015
EP 14749460 7/2016
(Continued)

OTHER PUBLICATIONS

Bez, "Chalcogenide PCM: a Memory Technology for Next Decade", IEEE, 2009, pp. 5.1.1-5.1.4.
(Continued)

*Primary Examiner* — Evan Pert
(74) *Attorney, Agent, or Firm* — Wells St. John P.S.

(57) ABSTRACT

Some embodiments include integrated devices, such as memory cells. The devices may include chalcogenide material, an electrically conductive material over the chalcogenide material, and a thermal sink between the electrically conductive material and the chalcogenide material. The thermal sink may be of a composition that includes an element in common with the electrically conductive material and includes an element in common with the chalcogenide material. Some embodiments include a method of forming a memory cell. Chalcogenide material may be formed over heater material. Electrically conductive material may be formed over the chalcogenide material. A thermal sink may be formed between the electrically conductive material and the chalcogenide material. The thermal sink may be of a composition that includes an element in common with the
(Continued)

electrically conductive material and includes an element in common with the chalcogenide material.

20 Claims, 4 Drawing Sheets

Related U.S. Application Data division of application No. 13/298,722, filed on Nov. 17, 2011, now Pat. No. 8,723,155.

(52) U.S. Cl.
CPC ....... *H01L 45/1233* (2013.01); *H01L 45/1286* (2013.01); *H01L 45/141* (2013.01); *H01L 45/144* (2013.01); *H01L 45/16* (2013.01); *H01L 45/165* (2013.01); *H01L 45/1608* (2013.01); *H01L 45/1675* (2013.01)

(56) References Cited

U.S. PATENT DOCUMENTS

| | | | |
|---|---|---|---|
| 4,752,118 A | 6/1988 | Johnson | |
| 4,849,247 A | 7/1989 | Scanlon et al. | |
| 4,987,099 A | 1/1991 | Flanner | |
| 5,055,423 A | 10/1991 | Smith et al. | |
| 5,166,758 A | 11/1992 | Ovshinsky et al. | |
| 5,168,332 A | 12/1992 | Kunishima et al. | |
| 5,341,328 A | 8/1994 | Ovshinsky et al. | |
| 5,895,963 A | 4/1999 | Yamazaki | |
| 5,912,839 A | 6/1999 | Ovshinsky et al. | |
| 6,143,670 A | 11/2000 | Cheng et al. | |
| 6,611,453 B2 | 8/2003 | Ning | |
| 6,613,604 B2 | 9/2003 | Maimon et al. | |
| 6,661,330 B1 | 12/2003 | Young | |
| 6,664,182 B2 | 12/2003 | Jeng | |
| 6,692,898 B2 | 2/2004 | Ning | |
| 6,700,211 B2 | 3/2004 | Gonzalez | |
| 6,764,894 B2 | 7/2004 | Lowrey | |
| 6,815,704 B1 | 11/2004 | Chen | |
| 6,906,940 B1 | 6/2005 | Lue | |
| 7,148,140 B2 | 12/2006 | Leavy et al. | |
| 7,169,624 B2 | 1/2007 | Hsu | |
| 7,332,401 B2 | 2/2008 | Moore et al. | |
| 7,422,926 B2 | 9/2008 | Pellizzer et al. | |
| 7,453,111 B2 | 11/2008 | Ryoo et al. | |
| 7,619,933 B2 | 11/2009 | Sarin | |
| 7,638,787 B2 | 12/2009 | An et al. | |
| 7,646,631 B2 | 1/2010 | Lung | |
| 7,719,039 B2 | 5/2010 | Muralidhar et al. | |
| 7,772,680 B2 | 8/2010 | Manning | |
| 7,773,413 B2 | 8/2010 | Shalvi | |
| 7,785,978 B2 | 8/2010 | Smythe | |
| 7,800,092 B2 | 9/2010 | Liu et al. | |
| 7,803,655 B2 | 9/2010 | Johnson et al. | |
| 7,838,341 B2 | 11/2010 | Dennison | |
| 7,867,832 B2 | 1/2011 | Yang et al. | |
| 7,888,711 B2 | 2/2011 | Cheung et al. | |
| 7,915,602 B2 | 3/2011 | Sato | |
| 7,919,766 B2 | 4/2011 | Lung | |
| 7,935,553 B2 | 5/2011 | Scheuerlein et al. | |
| 7,974,115 B2 | 7/2011 | Jeong et al. | |
| 8,013,319 B2 | 9/2011 | Chang | |
| 8,110,822 B2 | 2/2012 | Chen | |
| 8,486,743 B2 | 7/2013 | Bresolin et al. | |
| 8,507,353 B2 | 8/2013 | Oh et al. | |
| 8,546,231 B2 | 10/2013 | Pellizzer et al. | |
| 8,614,433 B2 | 12/2013 | Lee et al. | |
| 8,723,155 B2 * | 5/2014 | Redaelli | H01L 45/06 257/4 |
| 8,765,555 B2 | 7/2014 | Van Gerpen | |
| 8,822,969 B2 | 9/2014 | Hwang | |
| 9,299,930 B2 * | 3/2016 | Redaelli | H01L 45/06 |
| 2002/0017701 A1 | 2/2002 | Kiersy et al. | |
| 2002/0173101 A1 | 11/2002 | Shau | |
| 2002/0177292 A1 | 11/2002 | Dennison | |
| 2004/0178425 A1 | 9/2004 | Kato | |
| 2004/0188668 A1 | 9/2004 | Hamann et al. | |
| 2005/0006681 A1 | 1/2005 | Okuno | |
| 2005/0110983 A1 | 5/2005 | Jeong et al. | |
| 2005/0117397 A1 | 6/2005 | Marimoto | |
| 2005/0162881 A1 | 7/2005 | Stasiak | |
| 2006/0073631 A1 | 4/2006 | Karpov et al. | |
| 2006/0073652 A1 | 4/2006 | Pellizzer et al. | |
| 2006/0076548 A1 | 4/2006 | Park et al. | |
| 2006/0110888 A1 | 5/2006 | Cho et al. | |
| 2006/0113520 A1 | 6/2006 | Yamamoto et al. | |
| 2006/0157679 A1 | 7/2006 | Scheuerlein | |
| 2006/0157682 A1 | 7/2006 | Scheuerlein | |
| 2006/0186440 A1 | 8/2006 | Wang et al. | |
| 2006/0226409 A1 * | 10/2006 | Burr | H01L 45/06 257/2 |
| 2006/0284279 A1 | 12/2006 | Lung et al. | |
| 2006/0286709 A1 | 12/2006 | Lung et al. | |
| 2007/0008773 A1 | 1/2007 | Scheuerlein | |
| 2007/0012905 A1 | 1/2007 | Huang | |
| 2007/0029676 A1 | 2/2007 | Takaura et al. | |
| 2007/0054486 A1 | 3/2007 | Yang | |
| 2007/0075347 A1 | 4/2007 | Lai et al. | |
| 2007/0075359 A1 | 4/2007 | Yoon et al. | |
| 2007/0108431 A1 | 5/2007 | Chen et al. | |
| 2007/0158698 A1 | 7/2007 | Dennison et al. | |
| 2007/0224726 A1 | 9/2007 | Chen et al. | |
| 2007/0235708 A1 | 10/2007 | Elmgreen et al. | |
| 2007/0272913 A1 * | 11/2007 | Scheuerlein | H01L 27/2409 257/4 |
| 2007/0279974 A1 | 12/2007 | Dennison et al. | |
| 2008/0014733 A1 | 1/2008 | Liu | |
| 2008/0017842 A1 | 1/2008 | Happ et al. | |
| 2008/0043520 A1 | 2/2008 | Chen | |
| 2008/0054470 A1 | 3/2008 | Amano et al. | |
| 2008/0067485 A1 | 3/2008 | Besana et al. | |
| 2008/0067486 A1 | 3/2008 | Karpov et al. | |
| 2008/0093703 A1 | 4/2008 | Yang et al. | |
| 2008/0101109 A1 | 5/2008 | Haring-Bolivar et al. | |
| 2008/0105862 A1 | 5/2008 | Lung et al. | |
| 2008/0123394 A1 | 5/2008 | Lee et al. | |
| 2008/0128677 A1 | 6/2008 | Park et al. | |
| 2008/0137400 A1 | 6/2008 | Chen et al. | |
| 2008/0138929 A1 | 6/2008 | Lung | |
| 2008/0157053 A1 | 7/2008 | Lai et al. | |
| 2008/0197394 A1 | 8/2008 | Caspary et al. | |
| 2009/0008621 A1 | 1/2009 | Lin et al. | |
| 2009/0017577 A1 | 1/2009 | An et al. | |
| 2009/0032794 A1 | 2/2009 | Hsiao | |
| 2009/0039333 A1 | 2/2009 | Chang et al. | |
| 2009/0072213 A1 | 3/2009 | Elmgreen et al. | |
| 2009/0072341 A1 | 3/2009 | Liu et al. | |
| 2009/0091971 A1 | 4/2009 | Dennison et al. | |
| 2009/0101883 A1 | 4/2009 | Lai et al. | |
| 2009/0108247 A1 | 4/2009 | Takaura et al. | |
| 2009/0115020 A1 | 5/2009 | Yang et al. | |
| 2009/0127538 A1 | 5/2009 | Ryoo et al. | |
| 2009/0147564 A1 | 6/2009 | Lung | |
| 2009/0166601 A1 | 7/2009 | Czubatyj et al. | |
| 2009/0194757 A1 | 8/2009 | Lam et al. | |
| 2009/0194758 A1 | 8/2009 | Chen | |
| 2009/0230378 A1 * | 9/2009 | Ryoo | G11C 11/5664 257/4 |
| 2009/0230505 A1 | 9/2009 | Dennison | |
| 2009/0298222 A1 | 12/2009 | Lowrey et al. | |
| 2009/0302300 A1 | 12/2009 | Chang et al. | |
| 2009/0321706 A1 | 12/2009 | Happ et al. | |
| 2010/0001248 A1 | 1/2010 | Wouters et al. | |
| 2010/0001253 A1 | 1/2010 | Arnold et al. | |
| 2010/0019221 A1 | 1/2010 | Lung et al. | |
| 2010/0054029 A1 | 3/2010 | Happ et al. | |
| 2010/0055830 A1 | 3/2010 | Chen et al. | |
| 2010/0065530 A1 | 3/2010 | Walker et al. | |
| 2010/0065804 A1 | 3/2010 | Park | |
| 2010/0072447 A1 | 3/2010 | Lung | |
| 2010/0072453 A1 | 3/2010 | Jeong et al. | |
| 2010/0107403 A1 | 5/2010 | Aubel et al. | |

(56) References Cited

U.S. PATENT DOCUMENTS

| | | |
|---|---|---|
| 2010/0151652 A1 | 6/2010 | Lung et al. |
| 2010/0163830 A1 | 7/2010 | Chang et al. |
| 2010/0163833 A1 | 7/2010 | Borghi et al. |
| 2010/0165719 A1 | 7/2010 | Pellizzer |
| 2010/0176368 A1 | 7/2010 | Ko et al. |
| 2010/0176911 A1 | 7/2010 | Park et al. |
| 2010/0203672 A1 | 8/2010 | Eun et al. |
| 2010/0207168 A1 | 8/2010 | Sills et al. |
| 2010/0213431 A1 | 8/2010 | Yeh et al. |
| 2010/0221874 A1 | 9/2010 | Kuo et al. |
| 2010/0243980 A1* | 9/2010 | Fukumizu ............ H01L 27/101 257/2 |
| 2010/0270529 A1 | 10/2010 | Lung |
| 2010/0301303 A1 | 12/2010 | Wang et al. |
| 2010/0301304 A1 | 12/2010 | Chen et al. |
| 2010/0301417 A1 | 12/2010 | Cheng et al. |
| 2010/0308296 A1 | 12/2010 | Pirovano et al. |
| 2010/0323490 A1 | 12/2010 | Sreenivasan et al. |
| 2010/0327251 A1 | 12/2010 | Park |
| 2011/0001114 A1 | 1/2011 | Zanderighi et al. |
| 2011/0031461 A1 | 2/2011 | Kang et al. |
| 2011/0068318 A1 | 3/2011 | Ishibashi et al. |
| 2011/0074538 A1 | 3/2011 | Wu et al. |
| 2011/0092041 A1 | 4/2011 | Lai et al. |
| 2011/0155984 A1 | 6/2011 | Redaelli et al. |
| 2011/0193042 A1 | 8/2011 | Maxwell |
| 2011/0193049 A1 | 8/2011 | Iwakaji et al. |
| 2011/0215436 A1 | 9/2011 | Tang et al. |
| 2011/0284815 A1 | 11/2011 | Kim et al. |
| 2011/0300685 A1 | 12/2011 | Horii et al. |
| 2011/0312178 A1 | 12/2011 | Watanabe et al. |
| 2012/0091422 A1 | 4/2012 | Choi et al. |
| 2012/0126196 A1 | 5/2012 | Pio |
| 2012/0241705 A1 | 9/2012 | Bresolin et al. |
| 2012/0256150 A1 | 10/2012 | Zagrebelny et al. |
| 2012/0256151 A1 | 10/2012 | Liu et al. |
| 2012/0273742 A1 | 11/2012 | Minemura |
| 2012/0305875 A1 | 12/2012 | Shim |
| 2013/0099888 A1 | 4/2013 | Redaelli et al. |
| 2013/0126812 A1* | 5/2013 | Redaelli ................ H01L 45/06 257/1 |
| 2013/0126816 A1 | 5/2013 | Tang et al. |
| 2013/0126822 A1 | 5/2013 | Pellizzer et al. |
| 2013/0277796 A1 | 10/2013 | Yang et al. |
| 2013/0285002 A1 | 10/2013 | Van Gerpen et al. |
| 2014/0117302 A1 | 5/2014 | Goswami |
| 2014/0206171 A1* | 7/2014 | Redaelli ................ H01L 45/06 438/382 |
| 2014/0217350 A1 | 8/2014 | Liu et al. |
| 2016/0111639 A1* | 4/2016 | Wells .................... H01L 45/04 365/148 |

FOREIGN PATENT DOCUMENTS

| | | |
|---|---|---|
| WO | WO 2005/041196 | 5/2005 |
| WO | WO 2010/073904 | 7/2010 |
| WO | PCT/US2012/063962 | 3/2013 |
| WO | WO 2013/039496 | 3/2013 |
| WO | PCT/US2012/063962 | 5/2014 |
| WO | PCT/US2014/011250 | 5/2014 |
| WO | PCT/US2014/011250 | 8/2015 |

OTHER PUBLICATIONS

Czubatyj et al., "Current Reduction in Ovonic Memory Devices", Downloaded from www.epcos.org/library/papers/pdf_2006/pdf.../Czubatyj.pdf prior to Nov. 17, 2011.

Fazio, "Future Directions of Non-Volatile Memory in Compute Applications", IEEE, 2009, pp. 27.7.1-27.7.4.

Lee et al., "Programming Disturbance and Cell Scaling in Phase Change Memory: For up to 16nm based 4F2 Cell", IEEE, 2010 Symposium on VLSI Technology Digest of Technical Papers, pp. 199-200.

Russo et al., "Modeling of Programming and Read Performance in Phase-Change Memories—Part II: Program Disturb and Mixed-Scaling Approach", IEEE Transactions on Electron Devices, vol. 55(2), Feb. 2008, pp. 515-522.

U.S. Appl. No. 13/276,523, filed Oct. 19, 2011, Redaelli et al.
U.S. Appl. No. 13/298,722, filed Nov. 17, 2011, Redaelli et al.
U.S. Appl. No. 13/298,840, filed Nov. 17, 2011, Tang et al.
U.S. Appl. No. 13/298,962, filed Nov. 17, 2011, Pellizzer et al.
U.S. Appl. No. 13/460,302, filed Apr. 30, 2012, Van Gerpen et al.
U.S. Appl. No. 13/460,356, filed Apr. 30, 2012, Van Gerpen.
U.S. Appl. No. 13/666,744, filed Nov. 1, 2012, Goswami.
U.S. Appl. No. 13/761,570, filed Feb. 7, 2013, Liu et al.
U.S. Appl. No. 14/242,588, filed Apr. 1, 2014, Lindenberg.
U.S. Appl. No. 14/293,577, filed Jun. 2, 2014, Pellizzer et al.
U.S. Appl. No. 14/295,770, filed Jun. 4, 2014, Pellizer.

Happ et al., "Novel One-Mask Self-Heating Pillar Phase Change Memory", IEEE, 2006 Symposium on 5 VLSI Technology Digest of Technical Papers; 2 pp.

Raoux et al., Effect of Ion Implantation on Crystallization Properties of Phase Change Materials, presented at E\PCOS201 0 Conference, Sep. 6-7, 2010, Politecnico di Milano, Milan, Italy.

Servalli; A 45nm Generation Phase Change Memory Technology; IEEE 2009; pp. IEDM09-113-116.

Villa et al.; A 45nm 1Gb 1.8V Phase-Change Memory; 2010 IEEE International Solid-State Circuits Conference; Feb. 9, 2010; pp. 270-271.

* cited by examiner

MEMORY CELLS, INTEGRATED DEVICES, AND METHODS OF FORMING MEMORY CELLS

RELATED PATENT DATA

This patent resulted from a continuation of U.S. patent application Ser. No. 14/225,111, which was filed Mar. 25, 2014, which issued as U.S. Pat. No. 9,299,930, and which is hereby incorporated herein by reference; which resulted from a divisional of U.S. patent application Ser. No. 13/298,722, which was filed Nov. 17, 2011, which issued as U.S. Pat. No. 8,723,155, and which is hereby incorporated herein by reference.

TECHNICAL FIELD

Memory cells, integrated devices, and methods of forming memory cells.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change materials reversibly transform from one phase to another through application of appropriate electrical stimulus. Each phase may be utilized as a memory state, and thus an individual PCM cell may have two selectable memory states that correspond to two inducible phases of the phase change material.

A problem that may occur during programming of the memory cells of a PCM array is that there may be thermal transfer between adjacent memory cells (so-called "thermal disturb"). Accordingly, the memory state of a memory cell may be disturbed when an adjacent memory cell is programmed, which can lead to unreliability of data storage within a memory array. The problem can increase with increasing downsizing of integration.

It would be desirable to develop PCM cell architectures which alleviate or prevent the above-discussed problem, and to develop methods of forming such PCM cell architectures.

DETAILED DESCRIPTION OF THE ILLUSTRATED EMBODIMENTS

Programming of a PCM cell may comprise heating of a chalcogenide material within the memory cell to cause a phase change within the chalcogenide material. Only a fraction of the total volume of the chalcogenide material within the cell may be heated. Some embodiments include recognition that thermal disturbance between adjacent memory cells may be reduced by controlling the size of the heated fraction of chalcogenide material within a memory cell during programming of the memory cell.

A PCM cell may comprise chalcogenide material between a heater and a top electrode. The chalcogenide material may be heated with the heater to cause the desired phase change within the chalcogenide material during programming. The size of the heated fraction of the chalcogenide material may be influenced by the overall thermal resistance along the chalcogenide material to the top electrode, including difference thermal resistance contributions. The difference thermal resistance contributions may include: chalcogenide material thermal resistance, top electrode thermal resistance, and interface thermal resistance between the two materials.

Some embodiments include provision of an interlayer to reduce (and in some cases, minimize) interface thermal resistance. Such interlayer may be referred to as a "thermal sink material." The thermal sink material is between chalcogenide material and a top electrode, and alters thermal resistance along an upper region of the chalcogenide material relative to a conventional PCM cell. The utilization of such thermal sink material may alleviate or prevent thermal disturb between adjacent PCM cells during programming of a memory array.

Example embodiments are described with reference to FIGS. 1-10.

Figure 1:
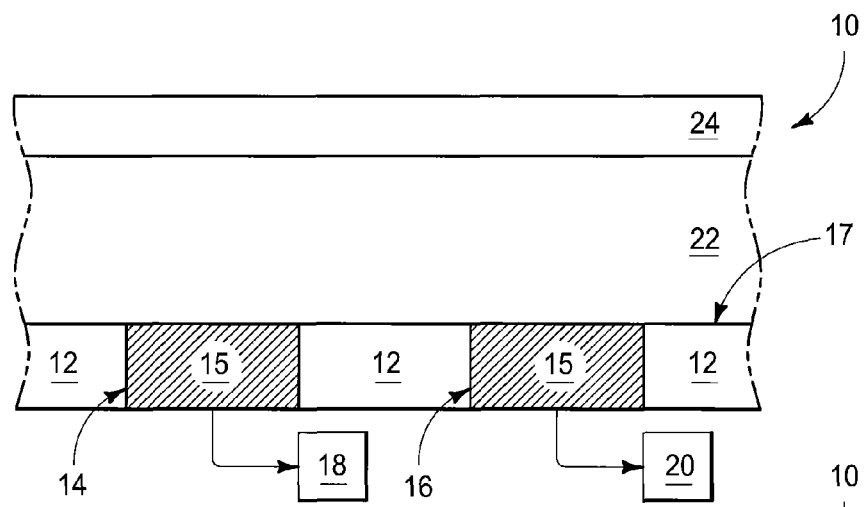
FIGS. 1-5 are diagrammatic cross-sectional views of a construction at various process stages of an example embodiment method of forming memory cells.

Referring to FIG. 1, a construction 10 comprises a pair of electrically conductive interconnects 14 and 16 extending through a dielectric material 12.

The dielectric material 12 may comprise any suitable composition or combination of compositions; and in some embodiments may comprise, consist essentially of, or consist of one or more of silicon dioxide, silicon nitride, and any of various doped silicate glasses (for instance, borophosphosilicate glass, phosphosilicate glass, fluorosilicate glass, etc.).

The interconnects 14 and 16 comprise electrically conductive material 15. Such electrically conductive material may comprise any suitable composition or combination of compositions; and in some embodiments may comprise, consist essentially of, or consist of tungsten.

The dielectric material 12, and interconnects 14 and 16, may be supported by a semiconductor base (not shown). Such base may comprise monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

The interconnects 14 and 16 be representative of a large number of interconnects formed across a semiconductor base. Ultimately, each interconnect is connected to a memory cell of a memory array (with example memory cells being shown in FIG. 5). The interconnects 14 and 16 are diagrammatically illustrated to be electrically connected to circuitry 18 and 20, respectively. Such circuitry may include control circuitry utilized for providing electrical input to individual memory cells during programming operations and during reading operations. The circuitry may also include access/sense lines (e.g., wordlines and bitlines) which electrically couple the memory cells to the control circuitry. In some embodiments, the illustrated interconnects 14 and 16 may be coupled to a common access/sense line, and in other embodiments the interconnects may be coupled to separate access/sense lines.

A planarized surface 17 extends across materials 12 and 15. Such planarized surface may be formed with any suitable processing, including, for example, chemical-mechanical polishing (CMP).

Heater material 22 is formed across the interconnects 14 and 16. The heater material is ultimately patterned into heater components of PCM cells (as described below with reference to FIG. 3), and may comprise any suitable composition or combination of compositions. In some embodiments, the heater material may comprise, consist essentially of, or consist of titanium and nitrogen. Such heater material may comprise TiN in some embodiments, where the chemical formula shows the components of the composition and is not utilized to indicate a specific stoichiometry. The heater material may be, for example, a TiN composite, doped TiN, etc. The heater material may be formed with any suitable processing, including, for example, one or more of atomic layer deposition (ALD), chemical vapor deposition (CVD) and physical vapor deposition (PVD).

Chalcogenide material 24 is formed over the heater material. The chalcogenide material may comprise any suitable composition. An example chalcogenide material comprises, consists essentially of, or consists of germanium, antimony and tellurium, and may be referred to as GST. In some embodiments, the chalcogenide material may correspond to $Ge_2Sb_2Te_5$. The chalcogenide material may be formed utilizing any suitable processing, including, for example, one or more of ALD, CVD and PVD. The chalcogenide material may be utilized as memory material in PCM cells in some embodiments (with example PCM cells being shown in FIG. 5).

Figure 2:
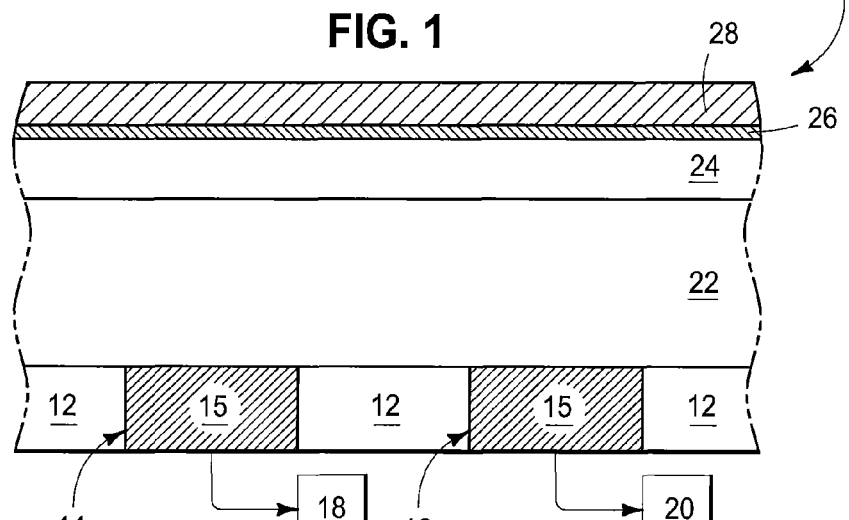

Referring to FIG. 2, thermal sink material 26 is formed over the chalcogenide material, and an electrically conductive capping material 28 is formed over the thermal sink material. In some embodiments, the material 28 may be referred to as a top electrode material.

In some embodiments, the thermal sink material 26 comprises a composition containing at least one element in common with the chalcogenide material 24 and at least one element in common with the capping material 28.

In some example embodiments, the material 28 comprises, consists essentially of, or consists of titanium (for instance, comprises elemental titanium or titanium nitride); the chalcogenide material comprises, consists essentially of, or consists of GST; and the thermal sink material comprises, consists essentially of, or consists of titanium in combination with one or both of tellurium and antimony.

As another example, in some embodiments the material 28 comprises, consists essentially of, or consists of a combination of titanium, aluminum and nitrogen (for instance, may be described by the chemical formula TiAlN, where such formula shows the components of the composition and is not utilized to indicate a specific stoichiometry); the chalcogenide material comprises, consists essentially of, or consists of GST; and the thermal sink material comprises, consists essentially of, or consists of one or both of titanium and aluminum in combination with one or both of tellurium and antimony.

As another example, in some embodiments the material 28 comprises, consists essentially of, or consists of tantalum (for instance, comprises elemental tantalum or tantalum nitride); the chalcogenide material comprises, consists essentially of, or consists of GST; and the thermal sink material comprises, consists essentially of, or consists of tantalum in combination with one or both of tellurium and antimony.

As another example, in some embodiments the material 28 comprises, consists essentially of, or consists of tungsten (for instance, comprises elemental tungsten or tungsten nitride); the chalcogenide material comprises, consists essentially of, or consists of GST; and the thermal sink material comprises, consists essentially of, or consists of tungsten in combination with one or both of tellurium and antimony.

The thermal sink material 26 may be formed with any suitable processing, and in some embodiments may be deposited utilizing one or more of ALD, CVD and PVD. In the embodiment of FIG. 2, the thermal sink material is deposited directly onto the chalcogenide material 24.

The thermal sink material may improve thermal dissipation within a memory cell to alleviate or prevent the thermal disturb problem discussed above in the "background" section of this disclosure.

The thermal sink material may be formed to any suitable thickness. In some embodiments, the thermal sink material may be kept very thin so that it does not substantially alter programming characteristics of an individual memory cell relative to an analogous memory cell lacking the thermal sink material. For instance, the thermal sink material may be formed to a thickness of less than or equal to about 5 nanometers; and in some embodiments may be formed to a thickness of from about 1 nanometer to about 5 nanometers. Such thin regions of thermal sink material may be sufficient to alleviate or prevent the thermal disturb problem, while having little impact on the programming characteristics of an individual memory cell.

The electrically conductive capping material 28 may be formed with any suitable processing, and in some embodiments may be deposited utilizing one or more of ALD, CVD and PVD. In the embodiment of FIG. 2, the electrically conductive capping material 28 is formed directly on an upper surface of the thermal sink material 26.

Figure 3:
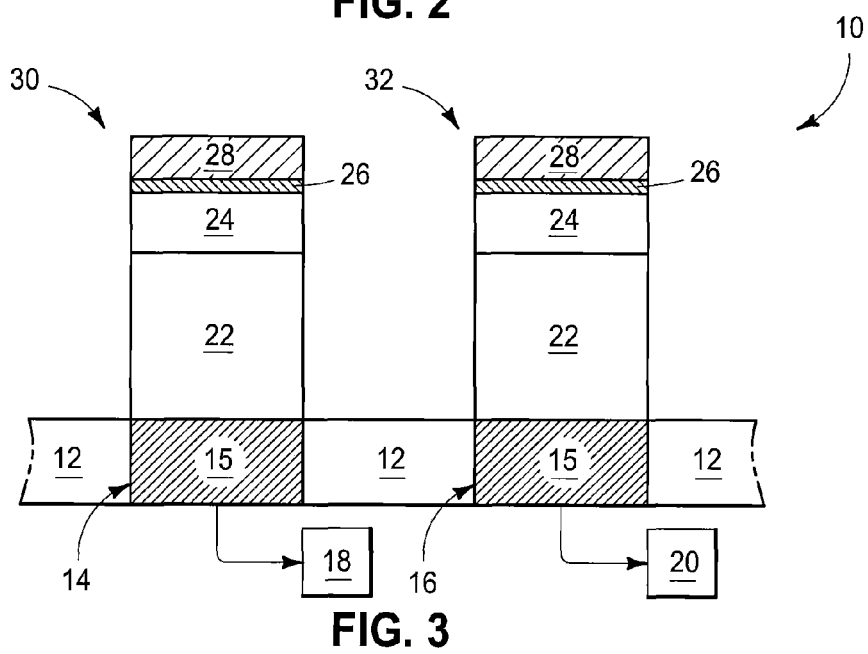

Referring to FIG. 3, the materials 22, 24, 26 and 28 are patterned into memory cells 30 and 32. The memory cell 30 is directly over and electrically coupled with interconnect 14; and the memory cell 32 is directly over and electrically coupled with interconnect 16. Materials 22, 24, 26 and 28 may be patterned with any suitable processing. For instance, a patterned mask (not shown) may be formed over material 28; a pattern from such mask may be transferred into the underlying materials 22, 24, 26 and 28 with one or more suitable etches; and then the mask may be removed to leave the construction shown in FIG. 3. The patterned mask may comprise any suitable composition, such as, for example, photolithographically-patterned photoresist and/or one or more materials patterned utilizing pitch-multiplication methodologies. The material 28 may be considered to correspond to top electrodes of the memory cells in some embodiments.

Figure 4:
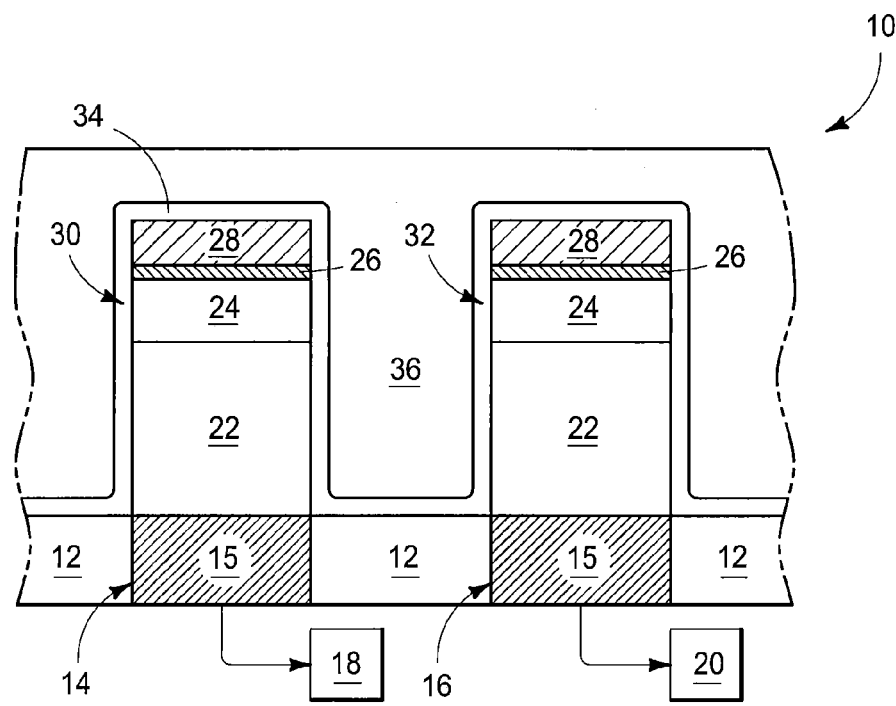

Referring to FIG. 4, an electrically insulative liner 34 is formed along and between the memory cells 30 and 32, and a dielectric material 36 is formed over the electrically insulative liner. The liner may comprise any suitable composition or combination of compositions, and in some embodiments may comprise, consist essentially of, or consist of silicon nitride. The dielectric material 36 may comprise any suitable composition or combination of compositions, and in some embodiments may comprise, consist essentially of, or consist of silicon dioxide and/or any of various doped silicate glasses.

Figure 5:
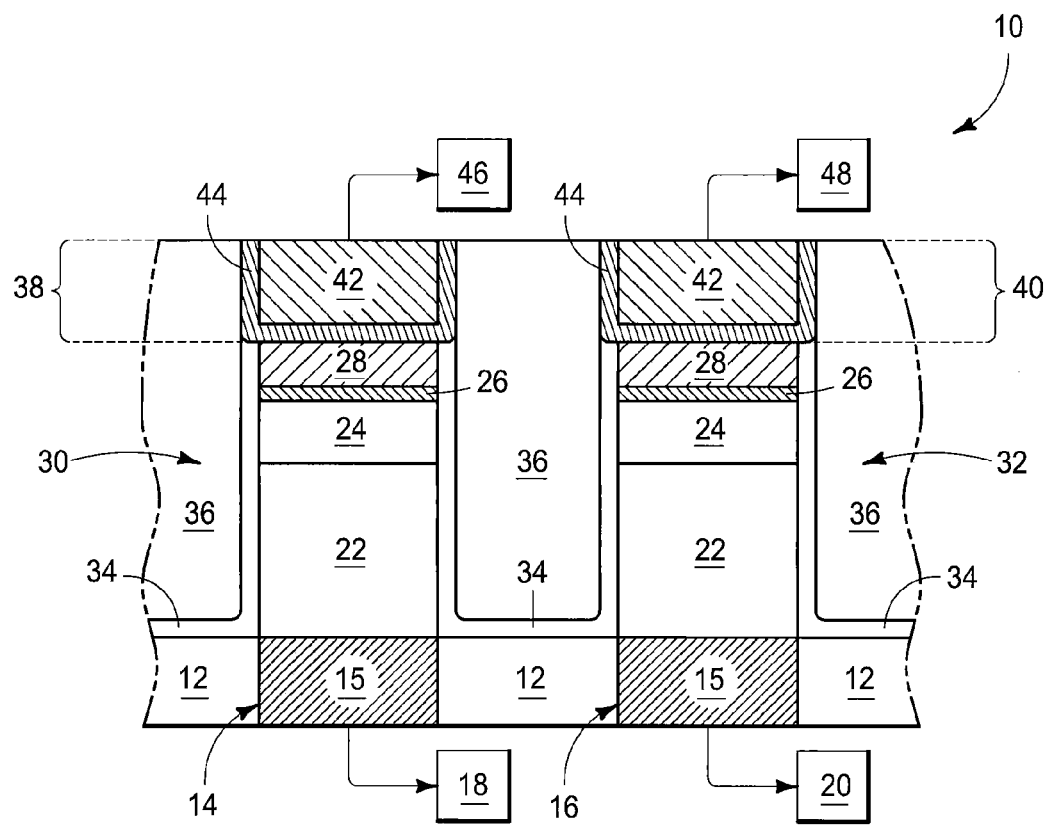

Referring to FIG. 5, electrically conductive structures 38 and 40 are formed over memory cells 30 and 32, respectively. The electrically conductive structures may be lines that extend in and out of the page relative to the cross-sectional view of FIG. 5. In the shown embodiment, each of the electrically conductive structures comprises a conductive core material 42 and a barrier material 44 along an outer periphery of the core material. In some embodiments, the core material may comprise, consist essentially of, or consist of copper; and the barrier material may be a barrier to copper migration. In such embodiments, the barrier material may comprise any suitable composition, and may, for example, comprise a ruthenium-containing material. In some embodiments, other conductive materials besides the shown materials 42 and 44 may be utilized in conductive structures 38 and 40. If the conductive core material 42 does not comprise components which migrate, the barrier material 44 may be omitted.

The structures 38 and 40 are shown connected to circuitry 46 and 48, respectively. In some embodiments, structures 38 and 44 may correspond to access/sense lines, and the circuitry 46 and 48 may be utilized to control electrical flow through such access/sense lines. The memory cells 30 and 32 may be representative of a large number of cells of a PCM array, and each memory cell of such array may be uniquely addressed through the combination of an access/sense line connected to the illustrated bottoms of the cells through conductive material 15, and an access/sense line connected to the illustrated tops of the cells through electrically conductive capping material 28.

The thermal sink material 26 can reduce heating within the memory cells during programming relative to heating which may otherwise occur in the absence of such thermal sink material, and thus can alleviate or prevent thermal disturb between the adjacent memory cells 30 and 32 relative to the thermal disturb that may otherwise occur in the absence of the thermal sink material. The same applies for cells in the perpendicular directions in the array (for instance, memory cells connected to the same bitline in some embodiments). Accordingly, the incorporation of the thermal sink material 26 into memory cells 30 and 32 may beneficially alleviate or prevent the thermal disturb problem that may be associated with some conventional PCM arrays.

The utilization of thermal sink material 26 having components in common with both the chalcogenide material 24 and the electrically conductive capping material 28 alleviates thermal mismatch that may otherwise occur. Specifically, one surface of the thermal sink material is directly against the chalcogenide material, and another surface of the thermal sink material is directly against the electrically conductive capping material. The formulation of the thermal sink material to have a component in common with the chalcogenide material may alleviate or prevent thermal mismatch that may otherwise occur between the thermal sink material and the chalcogenide material (with "thermal mismatch" including, for example, substantially different coefficients of thermal expansion that may lead to peeling or separation between the adjacent materials during changes in temperature). Similarly, the formulation of the thermal sink material to have a component in common with the electrically conductive capping material may alleviate or prevent thermal mismatch that may otherwise occur between the thermal sink material and such electrically conductive capping material.

The utilization of thermal sink material 26 having components in common with both the chalcogenide material 24 and the electrically conductive capping material 28 may improve adhesion between the chalcogenide material and the capping material in some embodiments, and specifically may improve adhesion as compared to structures lacking such thermal sink material.

The various materials of the memory cells 30 and 32 shown in FIG. 5 may comprise any suitable thicknesses. For instance, material 22 may be formed to a thickness of at least about 30 nanometers, material 24 may be formed to a thickness within a range of from about 30 nanometers to about 50 nanometers, material 26 may be formed to a thickness within a range of from about 1 nanometer to about 5 nanometers, and material 28 may be formed to a thickness within a range of from about 20 nanometers to about 50 nanometers.

The embodiment of FIGS. 1-5 forms thermal sinks within PCM cells by depositing thermal sink material 26 directly onto chalcogenide material 24. Such is one of many methods for forming thermal sinks within PCM cells. Another example embodiment method is described with reference to FIGS. 6-8.

Figure 6:
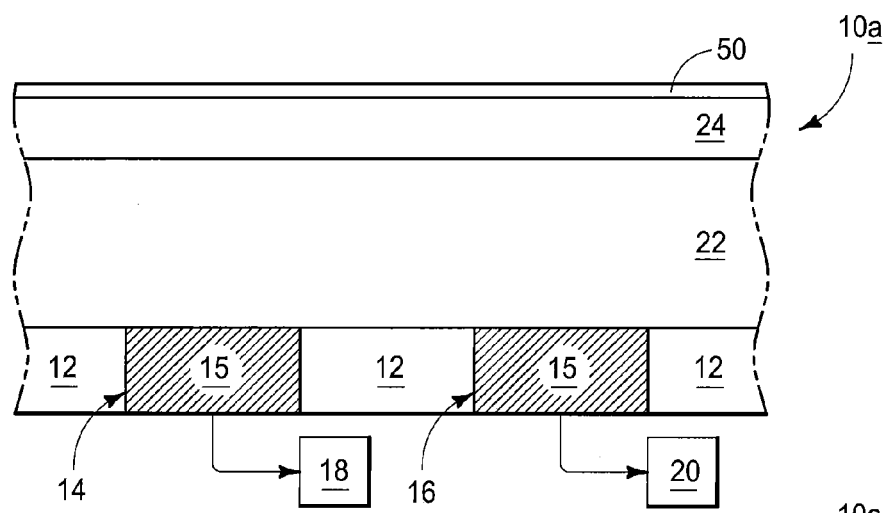
FIGS. 6-8 are diagrammatic cross-sectional views of a construction at various process stages of another example embodiment method of forming memory cells. The process stage of FIG. 6 may follow that of FIG. 1.

Referring to FIG. 6, a construction 10a is shown at a processing stage subsequent to that of FIG. 1. The construction comprises a precursor material 50 formed directly on an upper surface of chalcogenide material 24. The precursor material ultimately combines with a component from the chalcogenide material 24 and/or from the electrically conductive capping material 28 (shown in FIG. 7) to form a thermal sink comprising components in common with both the chalcogenide material and the electrically conductive capping material. In some embodiments, the precursor material 50 may comprise a component in common with the capping material, and may be configured to react with the chalcogenide material 24 to form a thermal sink. For instance, in some embodiments the precursor material may comprise one or more of titanium, tantalum, tungsten and aluminum. The precursor material may be configured for reaction with the chalcogenide material by incorporating a leaving group into the precursor. For instance, the precursor may comprise a metallo-organic, a metal halide, etc.

Figure 7:
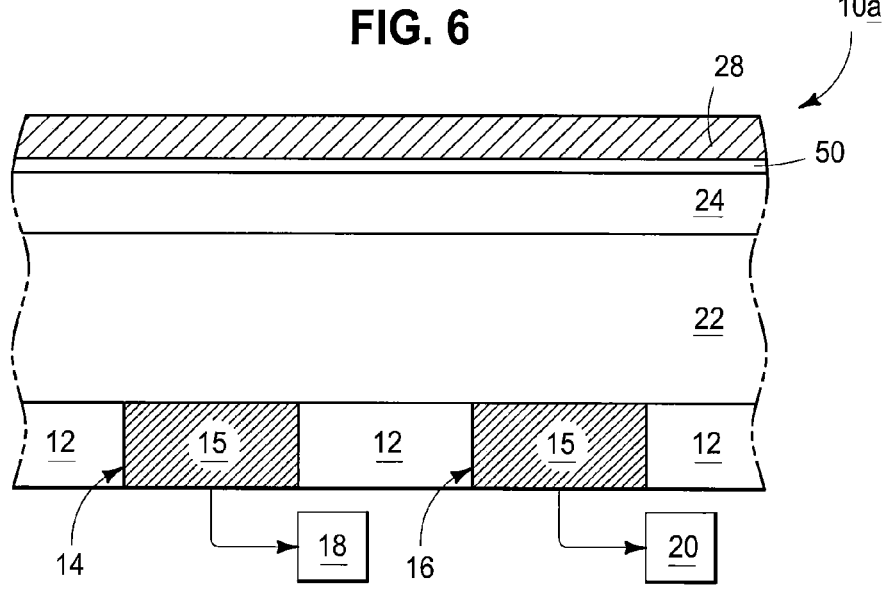

Referring to FIG. 7, the electrically conductive capping material 28 is formed directly on the precursor material 50.

Figure 8:
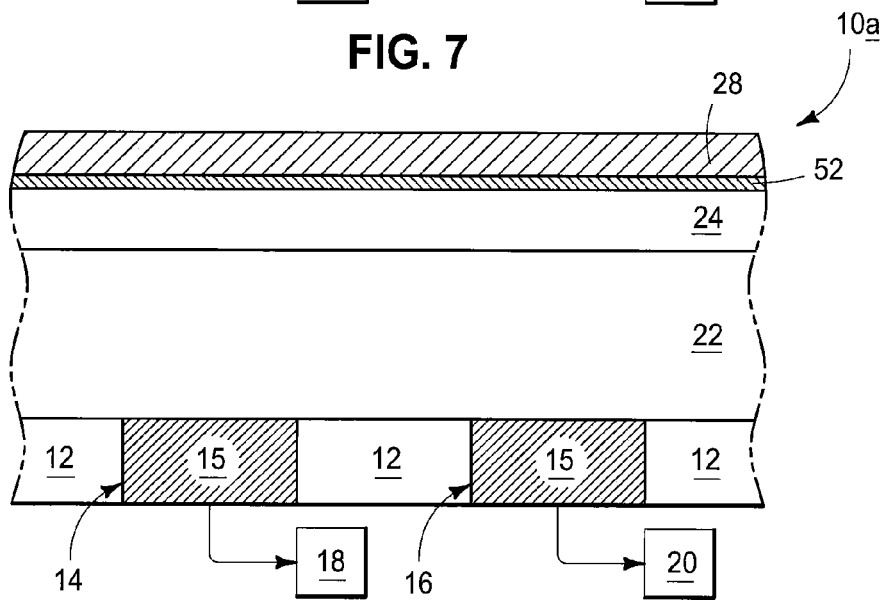

Referring to FIG. 8, construction 10a is subjected to thermal processing which converts precursor material 50 (FIG. 7) into a thermal sink material 52 comprising a component in common with chalcogenide material 24 and a component in common with electrically conductive capping material 28. The thermal processing may comprise, for example, heating of the precursor material 50 and the chalcogenide material 24 to a temperature of at least about 400° C. to induce reaction of the precursor material with the chalcogenide material. For instance, in some embodiments the chalcogenide material may comprise GST, the precursor material may comprise titanium, and the thermal treatment may form titanium telluride. As another example, in some embodiments the chalcogenide material may comprise GST, the precursor material may comprise tungsten, and the thermal treatment may form tungsten telluride.

The above-described thermal treatment may be conducted before, during and/or after formation of the electrically conductive capping material 28 in various embodiments. For instance, the electrically conductive capping material may be deposited under conditions having a high enough temperature to achieve the thermal treatment of the precursor material and the chalcogenide material. Alternatively, the precursor material and the chalcogenide material may be heated to the thermal treatment temperature prior to deposition of the electrically conductive capping material. In other embodiments, the precursor material and the chalcogenide material may be heated to the thermal treatment temperature after deposition of the electrically conductive capping material.

The construction 10a of FIG. 8 may be subsequently subjected to processing analogous to that described above with reference to FIGS. 3-5 to form an array of memory cells from such construction.

Another example embodiment method for forming a thermal sink within PCM cells is described with reference to FIGS. 9 and 10.

Figure 9:
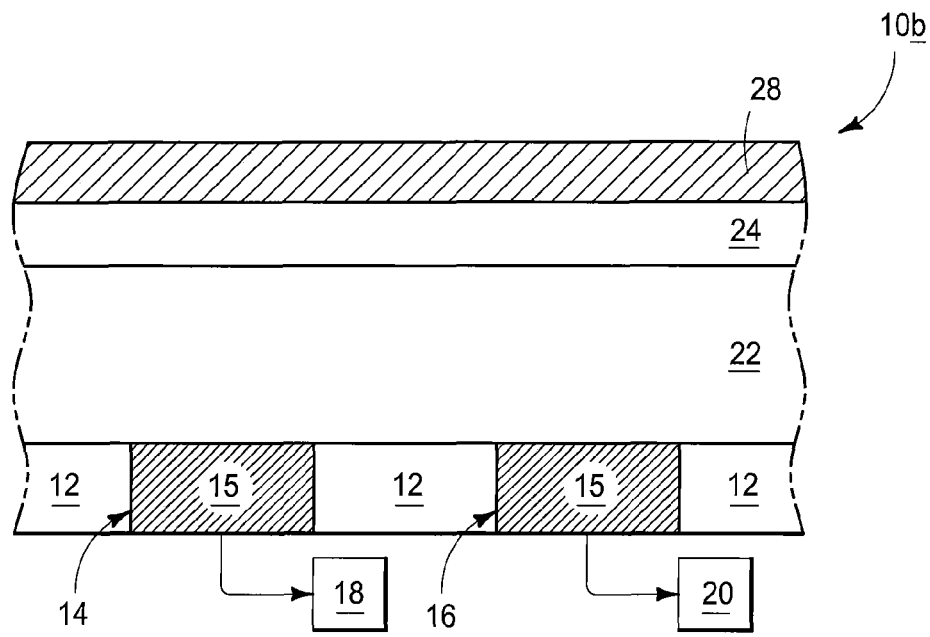
FIGS. 9 and 10 are diagrammatic cross-sectional views of a construction at various process stages of another example embodiment method of forming memory cells. The process stage of FIG. 9 may follow that of FIG. 1.

Referring to FIG. 9, a construction 10b is shown at a processing stage subsequent to that of FIG. 1. The construction comprises the electrically conductive capping material 28 formed directly on an upper surface of chalcogenide material 24.

Figure 10:
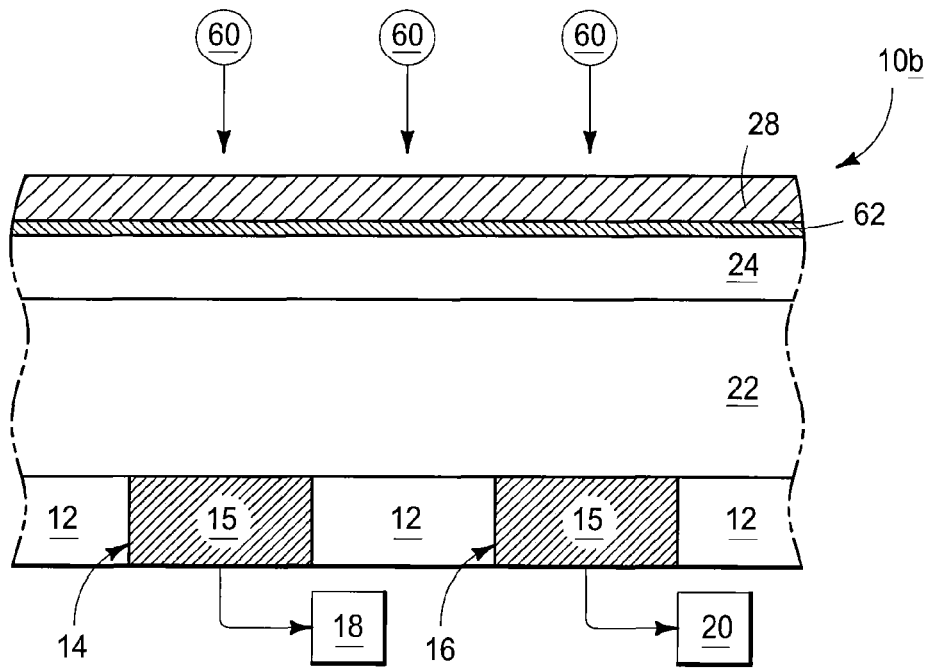

Referring to FIG. 10, one or more ions (i.e., dopants) are implanted through the electrically conductive capping material and to an interface of the capping material and the chalcogenide material. The ions cause intermixing across such interface to form a thermal sink 62 comprising one or more components of the chalcogenide material in combination with one or more components of the capping material. For instance, in some embodiments the electrically conductive capping material comprises titanium nitride; the chalcogenide material comprises GST; and the thermal sink comprises titanium telluride.

The construction 10b of FIG. 10 may be subsequently subjected to processing analogous to that described above with reference to FIGS. 3-5 to form an array of memory cells from such construction.

The embodiments described above show that the thermal sink material may be formed between an electrically conductive capping material and a chalcogenide material through any of numerous methods in various embodiments; and may be formed before, during, and/or after formation of the electrically conductive capping material.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated device comprising a chalcogenide material, a top electrode over the chalcogenide material, and an interlayer between the top electrode and the chalcogenide material. The interlayer lowers thermal resistance in the device relative to the thermal resistance which would occur across a top electrode/chalcogenide material interface of the device in the absence of the interlayer.

Some embodiments include an integrated device comprising a chalcogenide material, an electrically conductive material over the chalcogenide material, and a thermal sink between the electrically conductive material and the chalcogenide material. The thermal sink is directly against the conductive material and the chalcogenide material. The thermal sink comprises a composition that includes an element in common with the electrically conductive material and includes an element in common with the chalcogenide material.

Some embodiments include a memory cell comprising a heater material, a chalcogenide material over the heater material, an electrically conductive material over the chalcogenide material, and a thermal sink between the electrically conductive material and the chalcogenide material. The thermal sink is directly against both the electrically conductive material and the chalcogenide material. The thermal sink comprises a composition that includes an element in common with the electrically conductive material and includes an element in common with the chalcogenide material.

Some embodiments include a method of forming a memory cell. Chalcogenide material is formed over heater material. An electrically conductive material is formed over the chalcogenide material. A thermal sink is formed between the electrically conductive material and the chalcogenide material. The thermal sink is directly against the conductive material and the chalcogenide material. The thermal sink comprises a composition that includes an element in common with the electrically conductive material and includes an element in common with the chalcogenide material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated device, comprising:
a chalcogenide comprising antimony;
a conductive material over the chalcogenide; and a thermal sink between the conductive material and the chalcogenide, the thermal sink being directly against the conductive material and the chalcogenide; the thermal sink comprising a material that includes antimony and an element in common with the conductive material.

2. The device of claim 1 wherein the conductive material comprises titanium, and wherein the thermal sink comprises titanium and the antimony.

3. The device of claim 1 wherein:
the conductive material comprises titanium, aluminum and nitrogen; and
the thermal sink comprises the antimony in combination with one or both of titanium and aluminum.

4. The device of claim 1 wherein:
the conductive material comprises tantalum; and
the thermal sink comprises tantalum in combination with the antimony.

5. The device of claim 1 wherein:
the conductive material comprises tungsten; and
the thermal sink comprises tungsten in combination with the antimony.

6. The device of claim 1 wherein the thermal sink has a thickness of less than or equal to about 5 nanometers.

7. A memory cell, comprising:
a heater material;
chalcogenide material over the heater material and comprising antimony;
a conductive material over the chalcogenide material; and
a thermal sink between the conductive material and the chalcogenide material, the thermal sink being directly against the conductive material and the chalcogenide material;
the thermal sink comprising a composition that includes antimony and an element in common with the conductive material.

8. The memory cell of claim 7 wherein the conductive material comprises titanium, and wherein the thermal sink comprises titanium in combination with the antimony.

9. The memory cell of claim 7 wherein the conductive material comprises tantalum, and wherein the thermal sink comprises tantalum in combination with the antimony.

10. The memory cell of claim 7 wherein the conductive material comprises tungsten, and wherein the thermal sink comprises tungsten in combination with the antimony.

11. The memory cell of claim 7 wherein the conductive material comprises titanium, aluminum and nitrogen; and wherein the thermal sink comprises the antimony in combination with one or both of titanium and aluminum.

12. A method of forming a memory cell, comprising:
forming chalcogenide material over heater material, the heater material comprising metal nitride;
forming a conductive material over the chalcogenide material, the conductive material forming an electrode of the memory cell; and
forming a thermal sink between the conductive material and the chalcogenide material, the thermal sink comprising a composition that includes an element in common with the conductive material and includes an element in common with the chalcogenide material.

13. The method of claim 12 wherein the forming of the thermal sink comprises:
depositing a precursor material over the chalcogenide material; and
thermally treating the precursor material and the chalcogenide material to cause reaction between the precursor material and the chalcogenide material and thereby form the thermal sink.

14. The method of claim 13 wherein:
the chalcogenide material comprises germanium, antimony and tellurium;
the precursor material comprises titanium; and
the thermal sink comprises titanium and tellurium.

15. The method of claim 14 wherein the thermal treatment comprises heating the precursor material and the chalcogenide material to a temperature of at least about 400° C.

16. The method of claim 12 wherein the thermal sink is formed before forming the conductive material.

17. The method of claim 16 wherein the forming of the thermal sink comprises depositing thermal sink material over the chalcogenide material.

18. The method of claim 12 wherein the thermal sink is formed after forming the conductive material.

19. The method of claim 18 wherein the forming of the thermal sink comprises:
forming the conductive material over the chalcogenide material; and
implanting one or more ions through the conductive material to cause intermixing of one or more components of the chalcogenide material with one or more components of the conductive material to thereby form the thermal sink.

20. The method of claim 19 wherein:
the conductive material comprises titanium nitride;
the chalcogenide material comprises germanium, antimony and tellurium; and
the thermal sink comprises titanium telluride.

* * * * *